(12) United States Patent
Dunsmore et al.

(10) Patent No.: US 6,750,733 B1
(45) Date of Patent: Jun. 15, 2004

(54) COUPLED RESONATOR FILTER TUNING HAVING INTER-RESONATOR INTERACTION COMPENSATION

(75) Inventors: Joel P. Dunsmore, Sebastopol, CA (US); Sean Hubert, Santa Rosa, CA (US); James B. Kerr, Santa Rosa, CA (US); Dara Sariaslani, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/098,784

(22) Filed: Mar. 14, 2002

(51) Int. Cl.[7] ............................. H01P 1/20; H03J 3/26
(52) U.S. Cl. .................. 333/17.1; 333/174; 333/175; 333/202; 333/205; 333/207; 333/209
(58) Field of Search ............................. 333/17.1, 174, 333/175, 202, 205, 207, 208, 209

(56) References Cited

U.S. PATENT DOCUMENTS

| | | | | |
|---|---|---|---|---|
| 4,157,517 A | * | 6/1979 | Kneisel et al. ............... 333/205 |
| 4,410,868 A | * | 10/1983 | Meguro et al. .............. 333/202 |
| 5,220,300 A | * | 6/1993 | Snyder ........................ 333/210 |
| 5,227,747 A | * | 7/1993 | Komazaki et al. .......... 333/206 |
| 5,389,903 A | * | 2/1995 | Piirainen .................... 333/203 |
| 5,512,866 A | * | 4/1996 | Vangala et al. ............. 333/134 |
| 5,917,387 A | * | 6/1999 | Rice et al. ................... 333/174 |
| 6,356,163 B1 | * | 3/2002 | Dunsmore et al. ......... 333/17.1 |
| 6,504,446 B1 | * | 1/2003 | Ishihara et al. ............ 333/17.1 |
| 6,518,859 B1 | * | 2/2003 | Spampinato ................ 333/174 |

OTHER PUBLICATIONS

Dunesmore, "Tuning Band Pass Filter In the Time Domain", 1999 IEEE MTT–S Digest, 1999, pp. 1351–1354.*

* cited by examiner

Primary Examiner—Barbara Summons

(57) ABSTRACT

The present invention tunes a coupled resonator filter to a given tuning specification using a reference filter that was previously tuned to the specification. A method of tuning a subject filter comprises determining a frequency change for each resonator of the subject filter and applying each determined change to the respective resonator, such that the subject filter is tuned to the specification. The frequency changes are determined from frequency-pushing interactions between combinations of resonators in either the reference or subject filter. A system for tuning the subject filter comprises a measurement system, a tuning program stored in a system memory, and a controller that controls the measurement system and executes the tuning program. The tuning program comprises instructions that preferably implement the tuning method. A tuned coupled resonator filter comprises a plurality of resonators that are adjusted in accordance with the method or using the tuning system.

21 Claims, 3 Drawing Sheets

COUPLED RESONATOR FILTER TUNING HAVING INTER-RESONATOR INTERACTION COMPENSATION

TECHNICAL FIELD

The invention relates to RF and microwave filters. In particular, the invention relates to tuning coupled resonator filters used at RF and microwave frequencies.

BACKGROUND ART

Filters are important to the performance and operational viability of many modern radar, communcations and telecommunications systems. In most applications, filters provide selective control of frequency bands or extents of transmitted and/or received signals. Among the wide variety of filter types, coupled resonator filters are perhaps the most widely used, especially for applications requiring a bandpass frequency response characteristic in the radio frequency (RF) and/or microwave fequency ranges. Key featurs of many of the well-known coupled resonator filter realizations are the ability of such filters to provide relatively low passband loss and very high stopband isolation. In fact, for systems having operating frequencies in the RF and/or microwave range, a coupled resonator filter is often the only filter type that can provide adequate performance. Well-known coupled resonator filter realizations for RF and microwave applications include, but are not limited to, various microstrip and stripline filters, such as so-called combline filters, half wavelength couple line filters, hairpin line filters and interdigital filters; and waveguid filters, such as coupled cavity filters.

As the name implies, the coupled resonator filter comprises a plurality of resonant structures or resonators located between an input and an output of the filter. Each resonator has a frequency of resonance called a resonator frequency. Furthermore, each resonator is coupled to one or more of the other resonators in the filter. A given frequency response of the coupled resonator filter is produced by carefully controlling a relationship betweenthe resonator frequencies and coupling factors between resonators. Through such careful control, a diverse assortment of amplitude vs. frequency and/or phase vs. frequency characteristics both inside and outside of the filter passband can be achieved.

Although coupled resonator filters have a variety of designs and realizations, most of these filters provide for at least some form of tuning. The tuning enables adjustment of the filter following or during manufacture to account for variations in manufacturing and device tolerances. For example, a waveguide coupled-cavity filter is typically provided with a plurality of tuning screws that facilitate adjustment of the resonator frequencies and, in some cases, the coupling factors between resonators. During the manufacture of a cavity filter, the filter is tuned to match a design specification for the filter by changing the position of the various tuning screws. In some cases, tuning is used to expand the applicability of a given filter design. Center frequency and passband/stopband performance characteristics can often be adjusted by tuning to meet more than one particular performance specification with a single filter design. Thus, effective tuning can both reduce manufacturing costs associated with tolerance control and increase the applicability of a given filter design by enabling the filter to be adjusted according to a specification for particular application.

Unfortunately, tuning a coupled resonator filter can be and generally is very difficult. In particular, tuning coupled resonator filters is affected by a phenomenon known as frequency pushing. Frequency pushing is a tendency of a resonator frequency of a given resonator to be altered by a change in a resonator frequency of another resonator. For example, during tuning, a resonator frequency of a first resonator may be adjusted followed by an adjustment of a resonator frequency of a second resonator. If the resonator frequency of the first resonator is then checked, it is often the case that the resonator frequency of the first resonator will have changed as a result of inter-resonator interaction between the first and second resonator. In practice, the frequency pushing due to inter-resonator interaction is the result of coupling between resonators, a situation that generally can't be avoided in the coupled resonator filter. The usual approach is to iteratively tune each of the resonators multiple times until a specified tuned filter response for the filter is achieved. This iterative tuning can be very time consuming and therefore is relatively costly. In addition, a highly trained technician is typically required to perform the tuning. The need for iterative tuning by a skilled technician greatly increases the cost of most coupled resonator filters.

Accordingly, it would be advantageous to have an approach to tuning coupled resonator bandpass filters that accounted or compensated for frequency pushing due to inter-resonator interactions. Moreover, it would be advantageous if such a tuning approach for coupled resonator bandpass filters were deterministic and largely non-iterative. Such a tuning approach would address a longstanding need in the area of coupled resonator filter manufacturing and tuning.

SUMMARY OF THE INVENTION

The present invention provides for tuning coupled resonator filters. In particular, the present invention provides an essentially non-iterative, deterministic tuning of resonators of a coupled resonator filter. According to the present invention, frequncy-pushing interations between resonators of the filter are determined and the frequency of each resonator of the filter is adjusted. The adjustment accounts for the deteimined frequency-pushing ineractions. Moreover, a frequency change is determined for each resonator of the filter to be tuned, such that when the frequency change is applied to the resonators, the filter will be properly tuned with resect to a given tuning specification.

In essence, the present invention determines a nature and an amount of interaction between the resonators and then adjusts the tuning of the filter in an appropriate manner based on the determination. Furthermore, since the determined frequency change accounts for frequency-pushing interactions between resonators, tuning the filter according to the present invention can often be accomplished without the need for multiple iterations. The present invention is well suited for manual, semi-automatic and even automatic tuning of coupled resonator filters.

In one aspect of the present invention, a method of tuning a coupled resonator filter is provided. The method of tuning comprises determining a resonator frequency for each resonator of a reference or 'golden' filter. The resonator frequencies of the esonators of the reference filter are preferably determined by direct measurement of the reference filter. Alternatively, the resonator frequencies for the reference filter may be extracted from a model of the reference filter.

The method of tuning further comprises determining frequency pushing effects or parameters for each of the resonators with respect to the other of the resonators. The determination may be performed either using the reference filter or the subject filter, but preferably uses the reference filter. Determining frequency-pushing parameters comprises deriving a functional relationship between a change in a resonator frequency of one resonator due to a change in the resonator frequency of another resonator. Functional relationships are determined for all combinations of resonators. In a prefered embodiment, the functional relatonships are linear functions and a frequency-pushing matrix is assembled that contains slopes of the linear functions.

The method further comprises measuring a frequency of each resonator of the subject filter. As was the case for the reference filter, measuring a frequency of each resonator of the subject filter is preferably accomplished by direct measurement of the subject filter.

The method further comprises computing a frequency change for each resonator of the subject filter. In a preferred embodiment, computing the frequency change comprises inverting the frequency-pushing matrix and computing a vector difference between a first or reference frequency. vector containing the determined reference filter resonator frequencies and a second vector containing the measured subject filter resonator frequencies. Computing the frequency change further comprises multiplying the difference by the inverted frequency-pushing matrix thus yielding a vector containing frequency changes, one for each resonator.

The method further comprises applying the computed frequency changes to the resonators of the subject filter. When applied to the resonators, the frequency changes tune the subject filter, such that the performance of the tuned subject filter closely matches that of the reference filter.

In another aspect of the invention, a tuning system for tuning a coupled resonator filter is provided. The tuning system comprises a tuning controller, a memory, a tuning program stored in the memory, and a measurement system. The controller, by executing the computer program, controls the measurement system to produce measurements of a subject filter being tuned and a reference filter that serves as a gauge for the tuning of the subject filter. Instructions of the computer program preferably implement the method of tuning according to the present invention. In various embodiments, the tuning system can be a manual tuning system, a semi-automatic tuning system, or an automatic tuning system.

In still another embodiment, a tuned coupled resonator filter is provided. The tuned filter comprises a plurality of resonators. The plurality of resonators is tuned by the method of the present invention using a reference filter.

Advantageously, the present invention provides a simple, scalable, deterministic procedure for tuning of bandpass coupled resonator filters of various complexities. Further, the deterministic nature of the tuning of the present invention essentially eliminates the need for iterative tuning. In general, tuning may be accomplished in a single iteration of determining frequency changes of the resonators of the filter. The present invention is particularly attractive for manufacturing environments where significant production cost savings can be realized through reduced tuning time and difficulty. Moreover, the present invention is ideally suited for both semi-automatic and automatic filter tuning systems. In particular, the present invention reduces the need for such a skilled technician, as was conventionally necessary, in the tuning of production filters once the reference filter is available.

Certain embodiments of the present invention have other advantages in addition to and in lieu of the advantages described hereinabove. These and other features and advantages of the invention are detailed below with reference to the following drawings.

BRIEF DESCRIPTION OF THE DRAWINGS

The various features and advantages of the present invention may be more readily understood with reference to the following detailed description taken in coinjunction with the accompanying drawings, where like reference numerals designate like structural elements, and in which.

MODES FOR CARRYING OUT THE INVENTION

Figure 1:
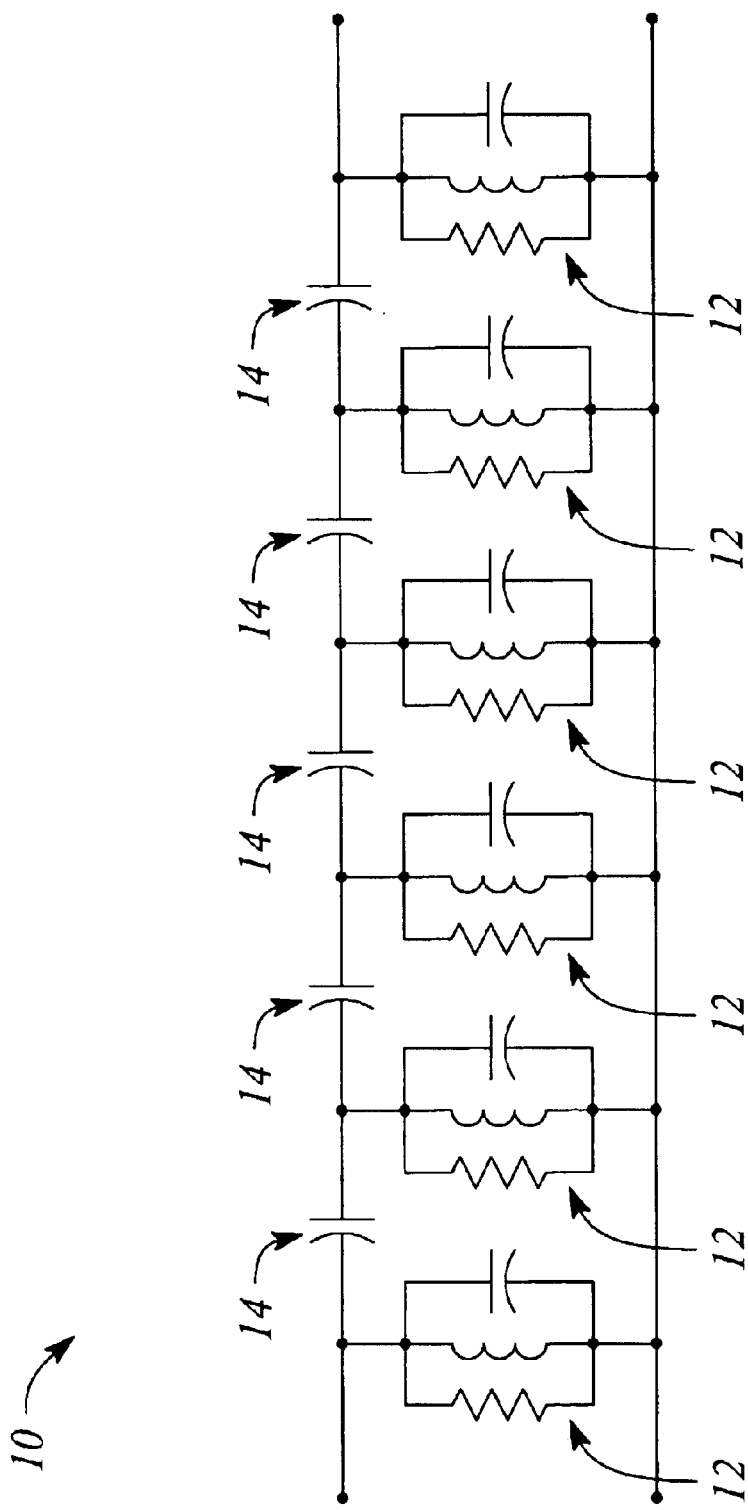
FIG. 1 illustrates a block diagram of 6-pole coupled resonator filter modeled with inductors, capacitors, and resistors.

FIG. 1 illustrates an example of a 6-pole coupled resonator filter 10 modeled using inductors, capacitors, and resistors. The coupled resonator filter 10 comprises a plurality of resonators 12. The resonators 12 are coupled to one another by a plurality of coupling elements 14. Coupling elements are typically either capacitive or inductive elements. The resonators 12 as modeled, comprise a parallel combination of an inductor, a capacitor, and a resistor. Tuning is achieved by adjusting a resonator frequency of one or more of the resonators 12. In the model illustrated in FIG. 1, such an adjustment may be accomplished by changing a capacitance of a capacitor and/or an inductance of an inductor of a resonator, for example. Furthermore, as referred to herein, a coupled resonator filter 10 is a filter having a bandpass frequency response.

Practical radio frequency (RF) and microwave coupled resonator filters are often realized using distributed elements instead of or in conjunction with discrete elements such as inductors, capacitors and resistors. An example of a coupled resonator filter that is realized using only distributed elements is a coupled-cavity waveguide filter. In such a filter realization, a waveguide cavity is employed as a resonator. Holes in walls separating the cavities act to couple the resonators in the coupled-cavity waveguide filter.

Moreover in such practical realizations, tuning may be accomplished by various means including, but not limited to, adjusting a position of a tuning screw or screws, adding or removing metallization, or changing an applied bias voltage on a voltage variable capacitor. One skilled in the art is familiar with coupled resonator filters, their well-known practical realizations, and the use of discrete elements to model such filters.

The present invention employs a so-called 'reference' coupled resonator filter, sometimes referred to as a 'golden' filter. The reference filter represents a standard of reference by which a subject filter being tuned is gauged. The objective of tuning is to adjust a frequency response of the subject filter such that it approximates a frequency response of the reference filter. Thus once tuned, the frequency responses of the subject filter and reference filter are said to 'match' one another.

The reference filter is preferably a filter of essentially the same type or design as that of the subject filter. Therefore, the reference filter has a same number n of resonators and a same number of coupling elements as the subject filter. More preferably, the reference filter also is constructed or manufactured in a manner that is equivalent to that of the subject filter. For example, if the subject filter is a coupled-cavity waveguide filter, the reference filter is preferably a coupled-cavity waveguide filter. On the other hand, a combline microstrip filter is preferably used as a reference filter if the subject filter is a combline microstrip filter.

Typically, tuning of the reference filter is accomplished by a means other than that of the present invention. For example, a skilled technician that is an expert at tuning such filters may tune the reference filter. However, once tuned, the reference filter remains a tuned golden filter or standard for future use. The reference filter may be a prototype filter built and tuned at some time in the past. In any event, the goal or objective is that the reference filter represents an ideally tuned filter of the subject type and construction according to a given specification for the filter performance. The present invention is then employed to adjust each subject filter so that its performance closely matches that of the corresponding reference filter.

Figure 2:
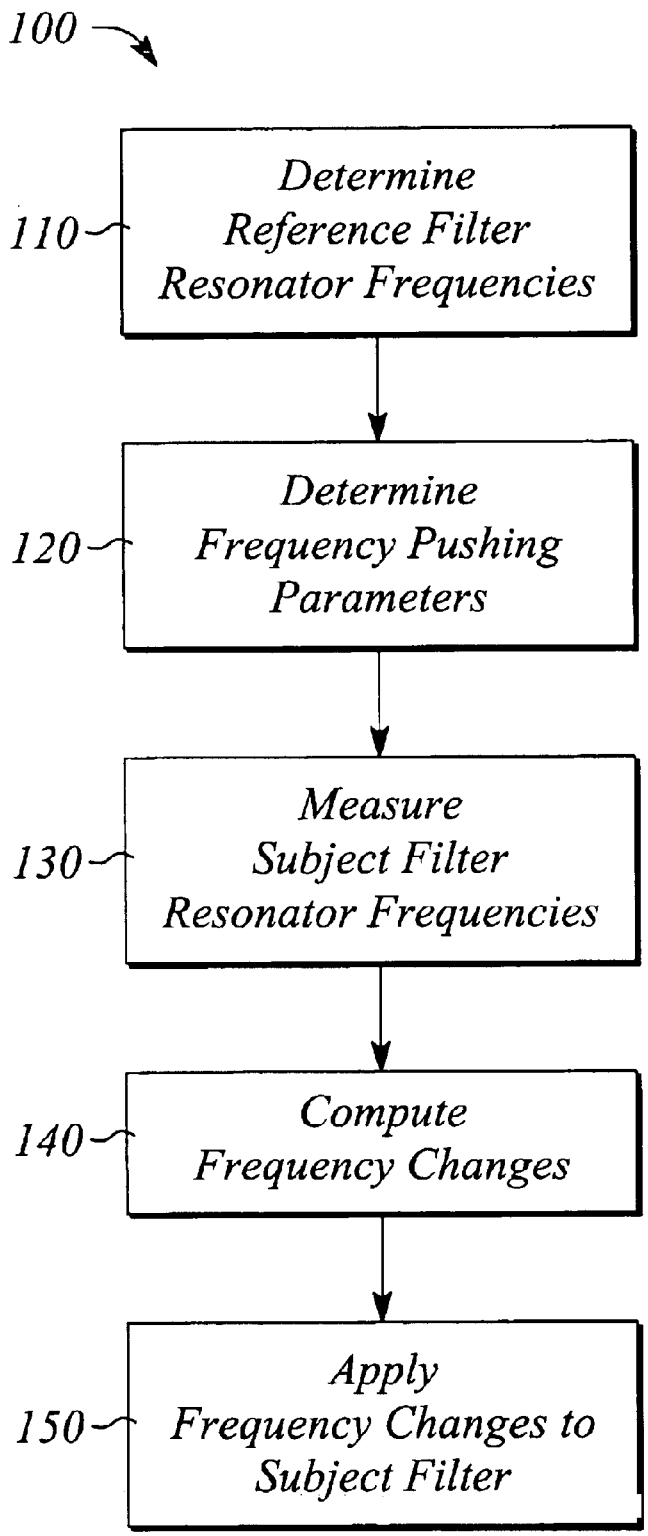
FIG. 2 illustrates flow chart of a method of tuning a coupled resonator filter according to the present invention.

In one aspect of the invention, a method 100 of tuning a coupled resonator filter having n resonators is provided. FIG. 2 illustrates a flow chart of the method 100 of tuning. The method 100 of tuning comprises determining 110 a resonator frequency $f^*_i$ for each of the resonators of the reference filter, where i is an integer that ranges from 1 to n. The determined resonator frequency $f^*_i$ represents an in situ resonance frequency of the i-th resonator of the reference filter. In particular, the resonator frequency $f^*_i$ includes all frequency pushing effects associated with the coupling of the i-th resonator to other resonators in the reference filter.

As was already discussed hereinabove, the presence of frequency-pushing effects associated with inter-resonator interactions is well known in the art. The frequency-pushing effects generally consist of changes in a resonance frequency of a resonator in a filter due to coupling between that resonator and other resonators of the filter. In practice, frequency-pushing effects, along with manufacturing tolerances and unaccounted variations in characteristics of materials used to construct the filter, are primarily responsible for the need to tune most coupled resonator filters.

Preferably, the resonator frequencies $f^*_i$ are determined 110 by direct in situ measurement of the resonators of the reference filter. For example, an advanced frequency domain method described in a co-pending application, U.S. Ser. No. 09/236,623, Dunsmore et al., "Tuning Method for Filters Having Multiple Coupled Resonators", incorporated herein by reference, may be used to measure the resonators of the reference filter. The method described in the co-pending application employs windowed or gated frequency response data along with windowed or gated time response data for the filter to isolate and measure the resonator frequencies $f^*_i$ of individual resonators in a coupled resonator filter. Typically, frequency and time response data is derived from measured return-loss S-parameter data (i.e., S11 and S22 data) generated by measuring the reference filter using a network analyzer.

In other cases, the resonator frequencies $f^*_i$ are determined 110 by extracting the frequencies $f^*_i$ from a simulation model of the reference filter. If a model is used, care should be taken to insure that the model is an accurate representation of the actual subject filter. One skilled in the art is familiar with such models and a need for accurate representation by such models.

Determining 110 the resonator frequencies for the reference filter results in a set of n frequencies $f^*_i$. In a preferred embodiment, the set of n frequencies $f^*_i$ is represented by a vector F* as given by equation (1).

$$F^* = \begin{bmatrix} f_1^* \\ f_2^* \\ \vdots \\ f_n^* \end{bmatrix} \quad (1)$$

Each frequency $f^*_i$ corresponds to a different one of the resonators in the filter. Thus, the resonator frequency $f^*_1$ is the resonator frequency determined 110 for resonator number 1, the resonator frequency $f^*_2$ is that determined 110 for resonator number 2, and so on. Numbering of the resonators is arbitrary, as one skilled in the art will readily recognize.

The method of tuning further comprises determining 120 frequency-pushing effects or parameters for each of the resonators with respect to all other the resonators of the plurality in the filter. In general, frequency-pushing parameter determination 120 may be performed either using the reference filter or the subject filter. Preferably, the determination 120 is accomplished using the reference filter.

If the subject filter is used, the subject filter must be pre-tuned, such that each resonator has a respective resonator frequency $f^*_i$ that is close to a corresponding resonator frequency $f^*_i$ of the reference filter. Preferably, when employing the subject filter to determine 120 the frequency-pushing parameters, each of the resonator frequencies $f_i$ of the subject filter should be pre-tuned to be within much less than one half bandwidth of the corresponding resonator frequency $f^*_i$ of the reference filter. As used herein, the one half bandwidth is with respect to a 3-db bandwidth of an overall bandpass response of the reference filter. Solely for the purpose of clarity with respect to the discussion hereinbelow, it is assumed that the reference filter is used in determining 120 the frequency-pushing parameters.

Determining 120 frequency-pushing parameters essentially comprises deriving a functional relationship between a change in a resonator frequency $f^*_i$ of one resonator due to a change in the resonator frequency $f^*_j$ of another resonator. Thus, the functional relationship accounts for a change in the resonator frequency $f^*_i$ of an i-th resonator due to a change in the resonator frequency $f^*_j$ of the j-th resonator for all j ranging from 1 to n.

Advantageously and unexpectedly, empirical studies have found that if the resonator frequencies $f^*_j$ are maintained within about a half of a bandwidth of an ideally tuned resonator frequency for the j-th resonator, the induced change in the resonator frequency $f^*_i$ of an i-th resonator is reasonably well approximated by a linear function of the change in the j-th resonator frequency $f^*_j$. Thus, the functional relationship describing the frequency pushing in a coupled resonator filter is a linear one and can be represented by a single slope value.

Given this observation regarding the linearity of the functional relationship, determining 120 the frequency-pushing parameters preferably comprises measuring the resonator frequency $f^*_i$ of the i-th resonator while detuning or changing the resonator frequency $f^*_j$ of the j-th resonator. Preferably, the resonator frequency $f^*_j$ of the j-th resonator is detuned by varying the resonator frequency $f^*_j$ from approximately one half bandwidth below an ideally tuned frequency to approximately one half bandwidth above the ideally tuned frequency of the j-th resonator. The ideally tuned frequency of the j-th resonator is the resonator frequency of the j-th resonator for the ideally tuned reference filter prior to detuning.

Determining 120 frequency-pushing parameters further comprises fitting a linear function to the measured data. A slope $m_{ij}$ of the fitted line provides the desired functional relationship given that the pushing effect on the i-th resonator due to detuning of the j-th resonator is approximated by a linear function. The slope $m_{ij}$ is called the 'pushing parameter' for the i-th resonator with respect to the j-th resonator. For example, a line may be fitted to the measured data using a linear least-squares method. One skilled in the art is familiar with linear least-squares and other related methods for fitting a line to data. All such line fitting techniques are within the scope of the present invention.

In a preferred embodiment, a frequency-pushing matrix M is assembled to contain the determined 120 frequency-pushing parameters $m_{ij}$. In particular, an element $m_{ij}$ of the matrix M located at an i-th row and a j-th column represents a slope of the fitted line for the frequency-pushing effect of a unit change in the j-th resonator on the i-th resonator. Thus, for a coupled resonator filter having n resonators, the frequency-pushing matrix M is an n×n matrix of the form given in equation (2).

$$M = \begin{bmatrix} m_{1,1} & m_{1,2} & \cdots & m_{1,n} \\ m_{2,1} & m_{2,2} & & m_{2,n} \\ \vdots & & \ddots & \vdots \\ m_{n,1} & m_{n,2} & \cdots & m_{n,n} \end{bmatrix} \quad (2)$$

An example of a frequency-pushing matrix M for a 6-pole filter (i.e., n=6) is given below.

$$M = \begin{bmatrix} 1 & -0.6527 & -0.4902 & -0.0080 & 0.0002 & 0.0000 \\ -0.0418 & 1 & -0.5763 & 0.0621 & -0.0002 & -0.0001 \\ 0.0004 & -0.0664 & 1 & -0.2535 & 0.0033 & -0.0002 \\ 0.0001 & 0.0029 & -0.2429 & 1 & -0.0671 & 0.0003 \\ 0.0000 & -0.0002 & 0.0623 & -0.5867 & 1 & -0.0418 \\ 0.0001 & 0.0000 & -0.0082 & -0.5051 & -6635 & 1 \end{bmatrix}$$

For the example frequency-pushing matrix M above, the element or pushing parameter $m_{2,1} = -0.0418$ represents a slope of a best fit line for a measured change in the resonator frequency $f^*_2$ of a second resonator for a unit change in the tuning of a first resonator. Similarly, the element $m_{5,4} = -0.5867$ of the example frequency-pushing matrix M is a slope of a best fit line for a measured change in the resonator frequency $f^*_5$ of a fifth resonator for a unit change in the tuning of a fourth resonator, and so on. Note that the elements $m_{i,i}$ on the diagonal of the frequency-pushing matrix M are always unity (e.g., exactly equal to 1) since these elements represent the effect of detuning the i-th resonator on an i-th resonator frequency.

The method 100 further comprises measuring 130 a resonator frequency $f_i$ for each resonator of the subject filter. Preferably, the resonator frequencies $f_i$ of each resonator in the subject filter are pre-tuned to be within approximately one half bandwidth of a final tuned frequency. Pre-tuning need not be particularly accurate and is intended to reduce potential errors in the method 100 associated with deviations in the linear ftunction approximation used to determine 120 frequency-pushing parameters.

As was the case for the reference filter, measuring 130 a separate resonator frequency $f_i$ for each resonator of the subject filter is preferably accomplished by direct measurement of the subject filter. For example, the method described in the co-pending application may be employed to measure the resonator frequencies $f_i$, as described hereinabove with respect to the reference filter. Measuring 130 the subject filter resonator frequencies $f_i$ results in a set of n frequencies $f_i$. In a preferred embodiment, the set of n frequencies $f_i$ is represented by a vector F as given by equation (3).

$$F = \begin{bmatrix} f_1 \\ f_2 \\ \vdots \\ f_n \end{bmatrix} \quad (3)$$

The method 100 of tuning a coupled resonator filter further comprises computing 140 a frequency change $\Delta f_i$ for each resonator of the subject filter and applying 150 the computed frequency changes $\Delta f_i$ to the resonators of the subject filter. In particular, the computed 140 frequency changes $\Delta f_i$ when applied 150 to the resonators of the subject filter will result in the tuning of the subject filter. The tuned subject filter has a frequency performance that closely matches that of the reference filter. Ideally, application 150 of the computed 140 frequency changes $\Delta f_i$ to the subject filter results in a filter that matches the tuning of the reference filter exactly. Of course, as one skilled in the art will readily recognize, some variation in tuning match may exist due to measurement errors and/or manufacturing tolerances. Both the ideal and variable tuning match situations are within the scope of the present invention. Usually, however, if reasonable care is taken in determining 110 reference filter resonator frequencies, determining 120 frequency-pushing parameters, and measuring 130 the subject filter resonator frequencies, tuning of the subject filter can be accomplished in a single application of the computed 140 frequency changes $\Delta f_i$.

Unfortunately, there are situations where acceptable tuning match is not achieved in a single iteration. In particular, an acceptable tuning match may not be produced for narrowband filters or in cases where precise application of the computed 140 frequency changes is difficult due to mechanical constraints. Advantageously in such cases, measuring 130 the subject filter resonator frequencies, computing 140 the frequency changes, and applying 150 the frequency changes to the subject filter may be repeated one or more times to bring the tuning of subject filter to within a prescribed tolerance of that of the reference filter tuning.

Figure 3:
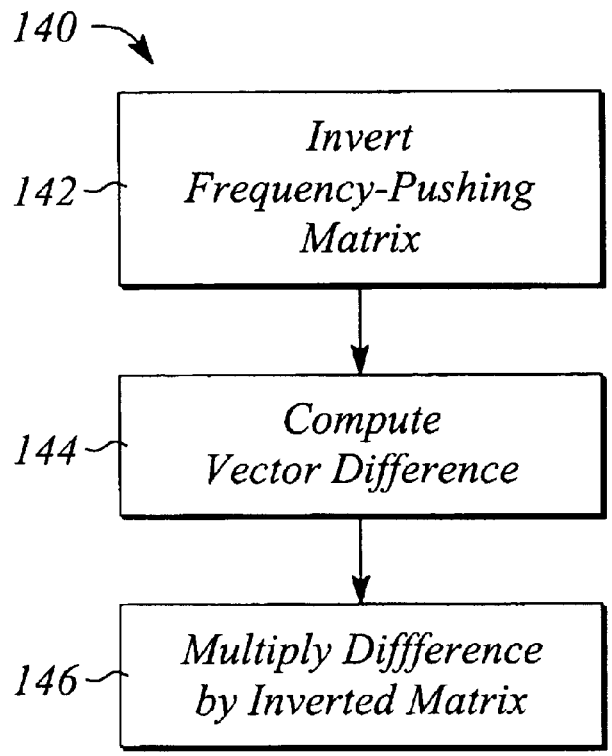
FIG. 3 illustrates a flow chart of a preferred embodiment of computing frequency changes for the method illustrated in FIG. 2.

FIG. 3 illustrates a preferred embodiment of computing 140 the frequency changes $\Delta f_i$. In the preferred embodiment, computing 140 the frequency change $\Delta f_i$ comprises inverting 142 the frequency-pushing matrix M and computing 144 a vector difference between the reference frequency vector F* containing the determined reference filter resonator frequencies $f^*_i$ and the vector F of the measured subject filter resonator frequencies $f_i$. Computing 140 the frequency change $\Delta f_i$ further comprises multiplying 146 the computed 144 vector difference by the inverted frequency-pushing matrix $M^{-1}$, thus yielding a vector $\Delta F$ containing n frequency changes $\Delta f_i$, one change $\Delta f_i$ corresponding to each resonator of the subject filter. Equation (4) provides details of computing 140 according to this preferred embodiment in the form of conventional matrix algebra notation.

$$\Delta F = M^{-1}(F^* - F) \quad (4)$$

When applied 150 to the resonators, the frequency changes $\Delta f_i$ thus computed 140 tune the subject filter, such that the performance of the tuned subject filter closely matches that of the reference filter.

As mentioned hereinabove, measuring 130, computing 140, and applying 150 may be repeated in an iterative fashion if the performance of the tuned subject filter fails to be a close enough match to that of the reference filter after application 150 of the frequency changes $\Delta f_i$ computed in a previous iteration. Advantageously, the number of such iterations generally will be less than a number of iterations of tuning without the method 100 of the present invention. In most cases, only a single iteration of the method 100 will be used.

Figure 4:
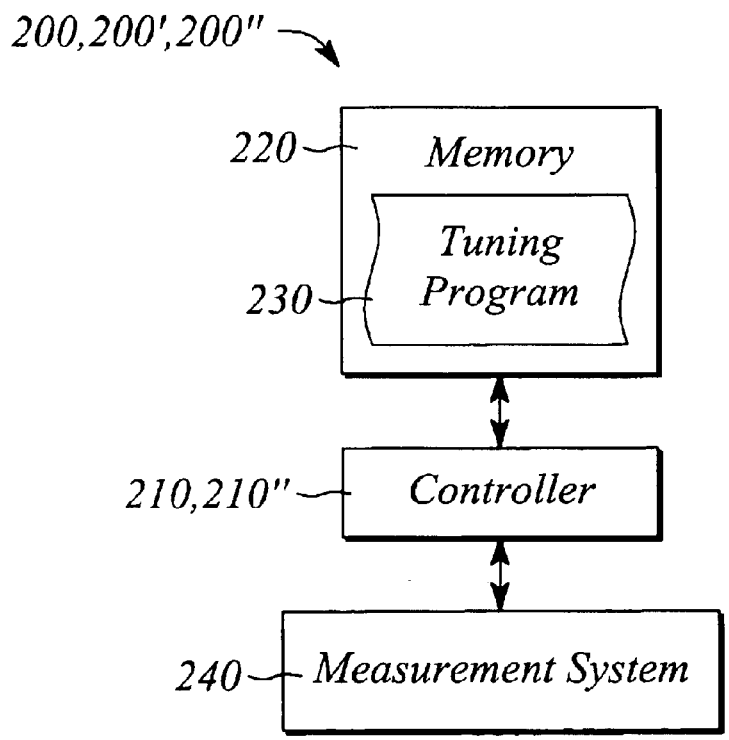
FIG. 4 illustrates a block diagram of a tuning system for tuning a coupled resonator filter according to the present invention.

In another aspect of the invention, a tuning system 200 for tuning a coupled resonator filter is provided. FIG. 4 illustrates a block diagram of the tuning system 200. The tuning system 200 comprises a tuning controller 210, a memory 220, a tuning computer program 230 stored in the memory 220, and a measurement system 240. The tuning system 200 tunes a subject filter to match transmission and reflection characteristics of a reference filter. Instructions of the computer program 230 employ measurements of a reference filter, a determination of frequency-pushing parameters for a reference filter or the subject filter, and measurements of the subject filter to determine a change in tuning of resonators of the subject filter. The measurement system 240, under the control of the controller 210, produces the measurements of the subject filter and the reference filter. The change in tuning comprises a change in resonator frequencies of the resonators of the subject filter. When the change in tuning is applied to the subject filter, the subject filter is said to be tuned. In a preferred embodiment, the tuning computer program 230 implements the method 100 of the present invention.

The tuning controller 210 executes the computer program 230 and tunes the subject coupled resonator filter. The controller 210 may be adapted to automatically tune the subject filter, including automatically adjusting elements of the subject filter to affect tuning. Alternatively, the system 200', 200" may simply provide instructions to a human operator regarding adjustments to be made. In the former case, the system 200 is referred to as an automatic filter tuning system. Specifics of such an automatic filter tuning system are necessarily dependent on the construction and design of the filter(s) being tuned. One of ordinary skill in the art could readily assemble such an automatic system given the construction and design of the filters without undue experimentation given the discussion herein.

In the later case, the system 200', 200" is referred to as a manual 200" or semi-automatic 200' tuning system since a human operator must actually carry out the tuning operations and may also be responsible for executing some or all of the instructions of the tuning program 230. An example of a semi-automatic tuning system 200' is a general-purpose computer, such as a personal computer (PC). The PC executes the instructions of the computer program 230 to compute the frequency changes from the measurements. In such a semi-automatic system 200', the PC also may control and receive measured data from the measurement system 240. The human operator applies the determined frequency changes to the subject filter.

The measurement system 240 measures the resonator frequencies of the reference filter and the subject filter. In addition, the measurement system 240 produces measurements from which frequency-pushing parameters can be determined. In a preferred embodiment, the measurement system 240 is a network analyzer.

An example of the manual tuning system 200" comprises a human operator acting as the controller 210" and employing, for example, a hand-held calculator for computing the frequency changes from the measurements. In this embodiment, the human assumes the role of executing the tuning program 230 instructions and controlling the measurement system 240. In addition, the human operator also applies the determined frequency changes to the subject filter. In the manual tuning system 200", the memory 220 may be paper and the tuning program 230 may be instructions printed on the paper. In such a manual system 200", the human operator also is responsible for controlling the operation of the measurement system 240 to produce the measurements used to compute the frequency changes.

According to another aspect of the present invention, a coupled resonator filter that is tuned according to the method 100 of the present invention, or with the tuning system 200, 200', 200", is provided.

Thus, there has been described a novel method 100 of tuning a coupled resonator filter by determining frequency changes in resonators of the subject filter. In addition, a tuning system 200, 200', 200" for tuning a coupled resonator filter has been described. It should be understood that the above-described embodiments are merely illustrative of the some of the many specific embodiments that represent the principles of the present invention. Clearly, those skilled in the art can readily devise numerous other arrangements without departing from the scope of the present invention.

What is claimed is:

1. A method of tuning a subject coupled resonator filter comprising:
   determining a resonator frequency for each resonator of a reference coupled resonator filter, the reference filter being a previously tuned filter that was tuned to a tuning specification;
   determining frequency-pushing parameters for each resonator of either the reference filter or the subject filter with respect to other resonators of the respective filter;
   measuring a frequency of each resonator of the subject filter;
   computing a frequency change for each resonator of the subject filter; and
   applying the computed frequency changes to the resonators of the subject filter, the applied frequency changes tuning the subject filter, such that the tuned subject filter has a performance that closely matches a performance of the reference filter.

2. The method claim 1, wherein determining the frequency-pushing parameters for each resonator with respect to other resonators of the filter comprises:
   deriving a functional relationship between a change in each resonator frequency of a resonator due to a change in a resonator frequency of each of the other resonators; and
   assembling a frequency-pushing matrix of the derived fiuctional relationships.

3. The method of claim 2, wherein the derived functioal relationships are linear functions, and wherein the assembled frequency-pushing matrix comprises slopes of the linear functions.

4. The method of claim 2, wherein computing a frequency change for each resonator of the subject filter comprises:
   inverting the frequency-pushing matrix; and
   computing a vector difference between a reference frequency vector containing the determined reference filter resonator frequencies and a subject frequency vector containing the measured frequencies of each resonator of the subject filter; and
   multiplying the vector difference by the inverted frequency-puhing matrix, such that a vector containing a frequency change for each resonator is computed.

5. A method of tuning a coupled resonator filter comprising:
   determining frequency-pushing interactions between resonators of the filter; and
   adjusting a frequency of each resonator of a subject filter, the subject filter being a filter to be tuned, the adjustment accounting for the determined frequency-pushing interactions, wherein the adjustment comprises:
      determining a frequency change for a resonator of the subject filter, the frequency change being a fumction of the detennined frequency-pushing interactions and a frequency of the resonator; and
      applying the deterinied frequency change to the resonator,
      wherein the frequency change is further a function of a reference frequency, the reference frequency being a frequency of a corresponding renator in either a reference coupled resonator filter tuned to a given specification or a model of the reference filter.

6. The method of claim 5, wherein one or both of determining frequency-pushing interactions between resonators of the filter and adjusting the frequency of each resonator the subject filter individually is performed one or more of manually, semi-automatically and automatically to tune the subject filter.

7. The method of claim 5, wherein determining the frequency change comprises:
   determining a resonator frequency for each resonator of the reference filter;
   measuring the frequency of each resonator of the subject filter; and
   computing the frequency change for each resonator of the subject filter.

8. The method of claim 7, wherein determining the resonator frequency for each resonator of the reference filter comprises either meauring the reference filter or the model.

9. The method of claim 7, wherein determining frequency-pushing interactions comprises:
   determining frequency-pushing parameters for each resonator of either the reference filter or the subject filter with respect to other resonators of the respective filter.

10. The method claim 9, wherein determining the frequency-pushing parameters for each resonator with respect to other resonators of the filter comprises:
   deriving a functional relationship between a change in a resonator frequency of a resonator due to a change in a resonator frequency of another resonator; and
   repeating deriving a functional relationship for all combinations of resonators of the filter.

11. The method of claim 10, wherein the derived functional relationships are linear functions, and wherein determining the frequency-pushing parameters further comprises assembling a frequency-pushing matrix that contains slopes of the linear functions.

12. The method of claim 11, wherein computing a frequency change for each resonator of the subject filter comprises:
   inverting the frequency-pushing matrix; and
   computing a vector difference between a reference frequency vector containing the determined reference filter resonator frequencies and a subject frequency vector containing the measured frequencies of each resonator of the subject filter; and
   multiplying the vector difference by the inverted frequency-pushing matrix, such that a vector containuing a frequency change for each resonator is computed.

13. The method of claim 9, wherein determining the frequency-pushing parameters for each resonator with respect to other resonators comprises using the resonators of the reference filter for the parameters determination.

14. The method of claim 7, wherein applying the determined frequency change to the resonator applies the computed frequency change, such that the subject filter has a performance that closely matches a performance of the reference filter.

15. A system for tuming a coupled resonator filter comprising:
   a memory,
   a tuning computer program stored in the memory;
   a measurement system; and
   a tuning controller, the controller executing the computer program and controlling the measurement system to produce measurements of a subject coupled resonator filter to be tuned and a reference coupled resonator filter, wherein the computer program comprises instructions that, when executed by the controller, determine frequency-pushing interactions between resonators of either the subject filter or the reference filter; and adjust a frquency of each resonator of the subject filter, the adjustment accounting for the determined frequency-pushing interactions.

16. The system of claim 15, wherein the computer program instructions further comprise instructions that determine a frequency change for each resonator of the subject filter, each frequency change being a function of the determined frequency-pushing interactions, a frequency of the respective resonator, and a reference frequency of a corresponding resonator of the reference filter; and apply each determined frequency change to the respective resonator, wherein the application of the determined frequency changes tunes the subject filter to a given tuning specification.

17. The system of claim 16, wherein the instruction that determine the frequency change comprise instructions tht determine a resonator frequency for each resonator of the reference filter; measure the frequency of each resonator of the subject filter; and compute the frequency change for each resonator of the subject filter.

18. The system of claim 17, wherein the instructions that determine frequency-pushing interactions comprise instructions that determine frequency-pushing parameters for each resonator of the respective filter with respect to other resonators of the filter.

19. The system of claim 18, wherein the instructions that determine the frequency-pushing parameters for each resonator with respect to other resonators of the filter comprise instructions that derive a functional relationship between a change in each resonator frequency of a resonator due to a change in a resonator frequency of each of the other resonators; and assemble a frequency-pushing matrix of the derived functional relationships, wherein the derived functional relationships are linear functions, and wherein the assembled frequency-pushing matrix comprises slopes of the linear functions.

20. The system of claim 19, wherein the instructions that compute a frequency change for each resonator of the suject filter comprise instructions that invert the frequency-pushing matrix; compute a vector difference between a reference frequency vector containing the determined reference filter resonator frequencies and a subject frequency vector containing the measured frequencies of each resonator of the subject filter; and multiply the vector difference by the inverted frequency-pushing matrix, such that a vector containing a frequency change for each resonator is computed.

21. The system of claim 15, wherein the controller one or more of manually, semi-automatically, and automatically causes the subject filter to be tuned.

* * * * *